(12) United States Patent
Kim et al.

(10) Patent No.: US 8,717,823 B2
(45) Date of Patent: *May 6, 2014

(54) MULTIPLE LEVEL PROGRAM VERIFY IN A MEMORY DEVICE

(75) Inventors: Taehoon Kim, Boise, ID (US); Deping He, Boise, ID (US); Jeffrey Alan Kessenich, Boise, ID (US)

(73) Assignee: Micron Technology, Inc., Boise, ID (US)

(*) Notice: Subject to any disclaimer, the term of this patent is extended or adjusted under 35 U.S.C. 154(b) by 7 days.

This patent is subject to a terminal disclaimer.

(21) Appl. No.: 13/537,150

(22) Filed: Jun. 29, 2012

(65) Prior Publication Data

US 2012/0269004 A1    Oct. 25, 2012

Related U.S. Application Data

(63) Continuation of application No. 12/436,955, filed on May 7, 2009, now Pat. No. 8,223,555.

(51) Int. Cl.
    *G11C 11/34* (2006.01)

(52) U.S. Cl.
    USPC ............ 365/185.22; 365/185.03; 365/185.18; 365/185.19; 365/185.24

(58) Field of Classification Search
    USPC ............ 365/185.03, 185.18, 185.19, 185.22, 365/185.24
    See application file for complete search history.

(56) References Cited

U.S. PATENT DOCUMENTS

| | | | |
|---|---|---|---|
| 5,570,315 A | 10/1996 | Tanaka et al. | |
| 6,459,621 B1 | 10/2002 | Kawahara et al. | |
| 6,954,380 B2 | 10/2005 | Ono et al. | |
| 8,223,555 B2 * | 7/2012 | Kim et al. ................ | 365/185.22 |
| 2006/0018164 A1 | 1/2006 | Wu | |
| 2006/0198189 A1 | 9/2006 | Lue et al. | |
| 2008/0316820 A1 | 12/2008 | Seol et al. | |
| 2009/0052269 A1 | 2/2009 | Moschiano et al. | |

* cited by examiner

*Primary Examiner* — Pho M Luu
*Assistant Examiner* — Thao Bui
(74) *Attorney, Agent, or Firm* — Leffert Jay Polglaze, P.A.

(57) ABSTRACT

A series of programming pulses are applied to a memory cell to be programmed. A program verify pulse, at an initial program verify voltage, is applied to the memory cell after each programming pulse. The initial program verify voltage is a verify voltage that has been increased by a quick charge loss voltage. The quick charge loss voltage is subtracted from the initial program verify voltage after either a programming pulse has reached a certain reference voltage or a quantity of programming pulses has reached a pulse count threshold.

20 Claims, 8 Drawing Sheets

MULTIPLE LEVEL PROGRAM VERIFY IN A MEMORY DEVICE

RELATED APPLICATION

This is a continuation of U.S. application Ser. No. 12/436,955, titled "MULTIPLE LEVEL PROGRAM VERIFY IN A MEMORY DEVICE," filed May 7, 2009, (now U.S. Pat. No. 8,223,555, issued Jul. 17, 2012) which is commonly assigned and incorporated herein by reference.

TECHNICAL FIELD

The present invention relates generally to memory and in a particular embodiment the present invention relates to non-volatile memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

FIG. 1 shows a plot of $V_{WL}$ versus time of typical prior art programming and verification operations. The figure shows the series of incrementally increasing programming pulses 101 being applied to the target memory cell as the word line voltage $V_{WL}$. The programming pulse increases a charge level on a floating gate of the target memory cell, thereby increasing the cell's threshold voltage $V_t$. After each programming pulse 101, a verify pulse 102 occurs at a $V_{vfy}$ level to determine if the cell's threshold voltage has increased to the target programmed level.

After programming, the memory cell can experience multiple forms of charge loss. These include single bit charge loss, intrinsic charge loss, and quick charge loss.

Single bit charge loss is the result of a defective memory cell that exhibits electron leakage from the floating gate through the tunnel oxide to the active region. This leakage is typically due to oxide defects or trap assisted tunneling and results in inferior long-term data retention.

Intrinsic charge loss is a detrapping of electron traps near the tunnel oxide interface out to the channel region. Intrinsic charge loss can be accelerated with high temperature stress and occurs over a long period of time. The trapped charge initially causes the cell $V_t$ to appear higher than the floating gate is programmed. The detrapping of these electrons long after programming then causes a onetime shift in the threshold voltage.

Quick charge loss is a detrapping of electron traps near the tunnel oxide interface out to the channel region and causes an immediate $V_t$ shift after a programming pulse. When a cell passes the verify operation, the programmed threshold voltage appears to be higher due to the trapped charge in the tunnel oxide. When the cell is read after the program operation has been completed, the cell has a $V_t$ that is lower than the $V_t$ obtained during the program verify operation due to the charge in the tunnel oxide leaking out to the channel region. This can require an enlargement of the $V_t$ distribution in order to accommodate all possible threshold voltages for a given state.

FIG. 2 shows the resulting $V_t$ of the target cell being programmed. The top $V_t$ plot 212, 216 is the maximum threshold voltage and the lower $V_t$ plot 211, 214 is the minimum threshold voltage, as illustrated in FIG. 3. As the programming pulses 101 of FIG. 1 are applied to a target cell control gate, the $V_t$ 211, 212 increases to approximately the $V_{t\_vfy}$ level. Once at this level, the target cell is verified and inhibited from further programming. The ideal $V_t$ 213, 215 is shown staying level at $V_t$. However, the real $V_t$ 214, 216 of the target cell begins to decrease almost immediately after the last programming pulse.

FIG. 3 illustrates a typical prior art $V_t$ distribution of memory cells programmed in the manner shown in FIG. 1 to a target programmed state. In FIG. 3, the dotted line 300 represents the ideal distribution while the solid line 301 represents the real distribution. The lower end 305 of the ideal distribution 300 corresponds to memory cells having a $V_t$ in accordance with plot 213 of FIG. 2 and the upper end 310 of the ideal distribution 300 corresponds to memory cells having a $V_t$ in accordance with plot 215. Similarly, the lower end 306 of the real distribution 301 corresponds to memory cells having a $V_t$ in accordance with plot 214 and the upper end 307 of the real distribution 301 corresponds to memory cells having a $V_t$ in accordance with plot 216.

The cells at the lower end of the ideal distribution 300 are verified at the $V_{pgm\_vfy}$ voltage. After the programming operation and subsequent inhibition of those cells, the distribution shifts in the negative direction by an amount equal to $V_{QCL}$ and ends at the lower $V_t$ 306. Such a shift in the distribution would necessitate an enlarged distribution that starts at the real lower $V_t$ 306 and extends to the ideal upper $V_t$ 310.

In a single level cell (SLC) memory device, a $V_t$ distribution enlargement does not typically affect the reading of a programmed memory cell. However, in a multiple level cell (MLC) memory device, the state distributions are typically more closely spaced in order to fit all of the states within a low supply voltage range. Enlarging the $V_t$ distributions in an MLC device can thus reduce the number of states that are programmable into the device. Additionally, the enlarged $V_t$ distributions can overlap and result in errors in reading the different states.

For the reasons stated above, and for other reasons stated below that will become apparent to those skilled in the art upon reading and understanding the present specification, there is a need in the art to reduce the effects of charge loss in a memory device.

DETAILED DESCRIPTION

Figure 1:
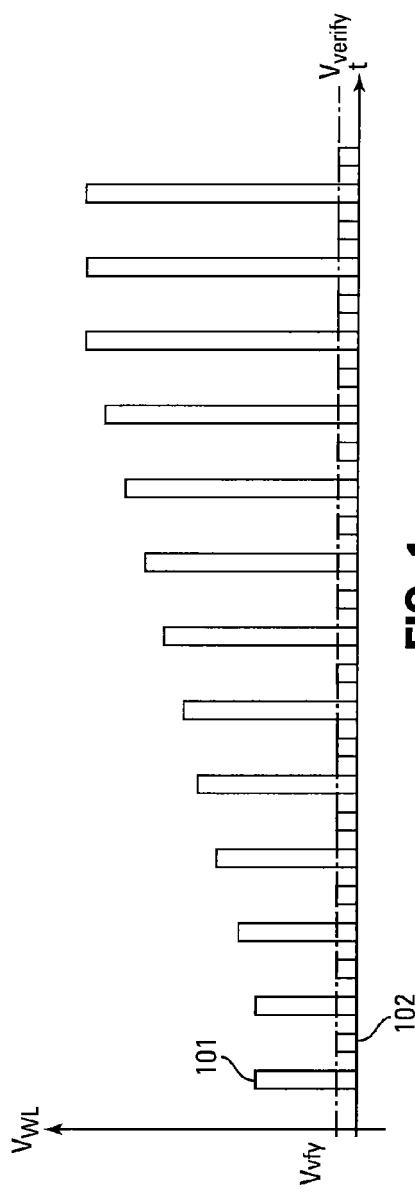
FIG. 1 shows a plot of $V_{WL}$ versus time of a typical prior art programming operation.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 4:
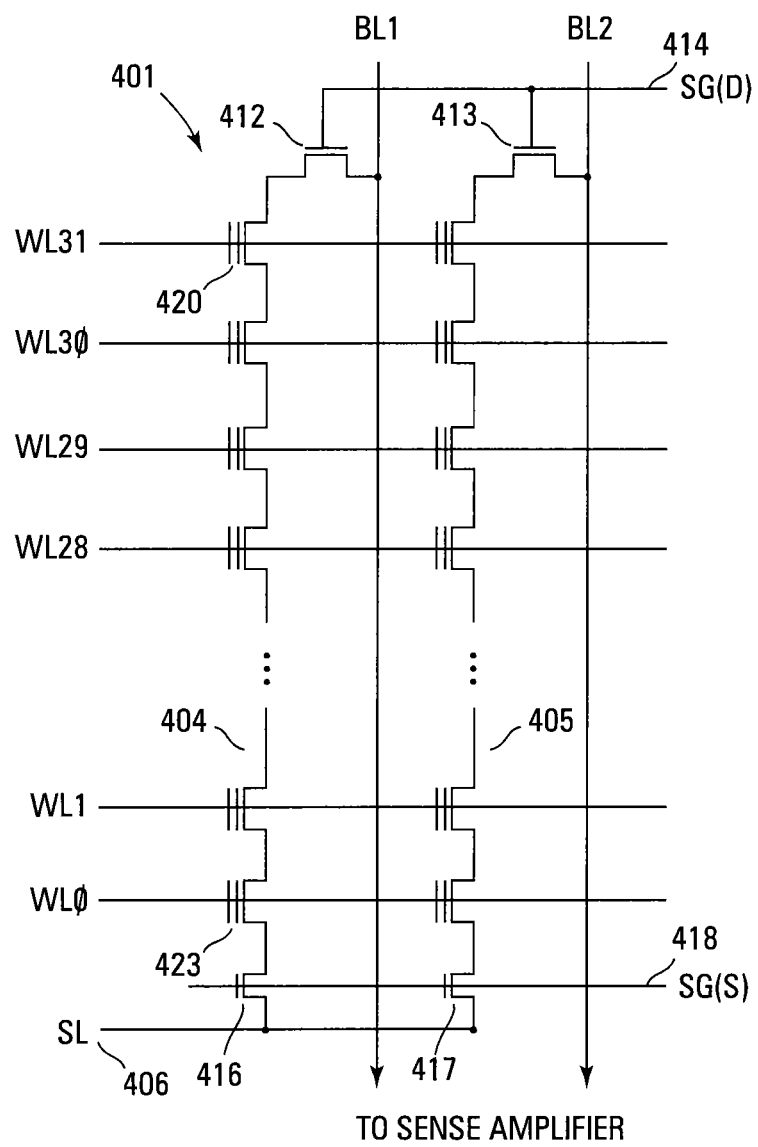
FIG. 4 shows a schematic diagram of one embodiment of a portion of a memory array.

FIG. 4 illustrates a schematic diagram of a portion of a NAND architecture memory array 401 comprising series strings of non-volatile memory cells on which one embodiment of the method for charge loss compensation can operate. While the subsequent discussions refer to a NAND memory device, the present embodiments are not limited to such an architecture but can be used in other memory device architectures as well.

The array is comprised of an array of non-volatile memory cells 401 (e.g., floating gate) arranged in columns such as series strings 404, 405. Each of the cells 401 are coupled drain to source in each series string 404, 405. An access line (e.g. word line) WL0-WL31 that spans across multiple series strings 404, 405 is connected to the control gates of each memory cell in a row in order to bias the control gates of the memory cells in the row. Data lines, such as bit lines BL1, BL2 are coupled to the strings and eventually connected to sense amplifiers (not shown) that detect the state of each cell by sensing current or voltage on a particular bit line.

Each series string 404, 405 of memory cells is coupled to a source line 406 by a source select gate 416, 417 and to an individual bit line BL1, BL2 by a drain select gate 412, 413. The source select gates 416, 417 are controlled by a source select gate control line SG(S) 418 coupled to their control gates. The drain select gates 412, 413 are controlled by a drain select gate control line SG(D) 414.

Each memory cell can be programmed as a single level cell (SLC) or multiple level cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC uses multiple $V_t$ ranges that each indicate a different state. Multilevel cells can take advantage of the analog nature of a traditional flash cell by assigning a bit pattern to a specific voltage range stored on the cell. This technology permits the storage of two or more bits per cell, depending on the quantity of voltage ranges assigned to the cell.

Figure 5:
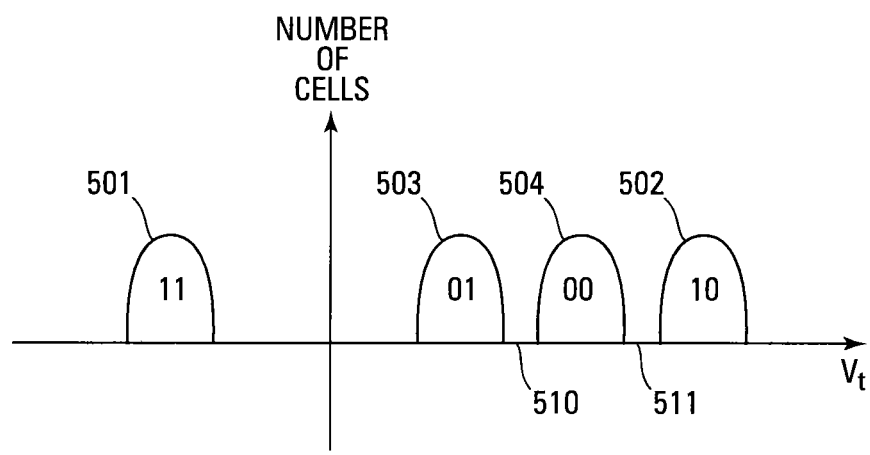
FIG. 5 shows one embodiment of $V_t$ distributions in accordance with the memory array of FIG. 4.

FIG. 5 illustrates one embodiment of $V_t$ distributions of four possible states to which memory cells of an array can be programmed, e.g., 00, 01, 10, and 11. This figure shows the memory cells' $V_t$ versus the number of cells in each programmed or erased state.

This diagram of FIG. 5 shows that the logical 11 state 501 is the most negative state and is typically referred to as the erased state. The logical 10 state 502 is the most positive state. The logical 01 state 503 and the logical 00 state 504 are located between the most negative and most positive states 501, 502. The states of FIG. 5 are for purposes of illustration only as the present embodiments may assign different logical states to each threshold voltage distribution.

In programming a memory cell, a memory cell's threshold voltage is moved from one state 501-504 to another. For example, a flash memory cell is typically programmed from the erased state 501. The cell's threshold voltage is increased by the application to the cell control gate of a series of incrementally increasing programming pulses that start at an initial, high voltage (e.g., approximately 16V) and increase by a step voltage (e.g., 1.0V) until the cell is programmed to the target $V_t$ representing the desired data or the programming algorithm concludes.

Figure 2:
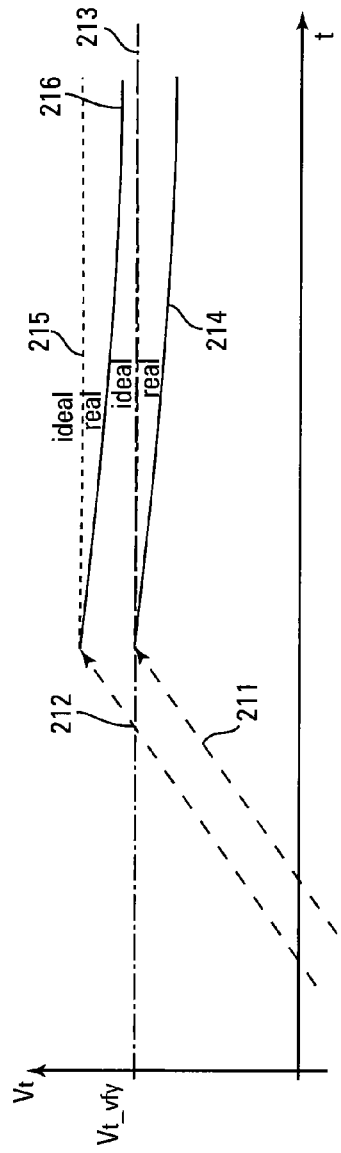
FIG. 2 shows a plot of the real and ideal $V_t$ of the target cell during the typical prior art programming operation of FIG. 1.

The distributions of FIG. 5 are separated by margins 510, 511 between the states 502-504. It can be seen that if the distributions were widened to compensate for the quick charge loss, as described in FIG. 2, one state might overlap another state and thus cause a read error.

The two bit MLC states of FIG. 5 are for purposes of illustration only. The disclosed embodiments for programming and program verification can be used on any number of states represented by any number of bits.

The program verification method, discussed subsequently, uses a dynamic, multiple verify level instead of the fixed verify level used in the prior art. The initial program verify of a programming operation is to a higher voltage, to take into account the initially higher memory cell threshold voltage due to the electrons trapped in the tunnel oxide layer. Subsequent verifications during the same programming operation are to a lower program verify voltage.

Figure 6:
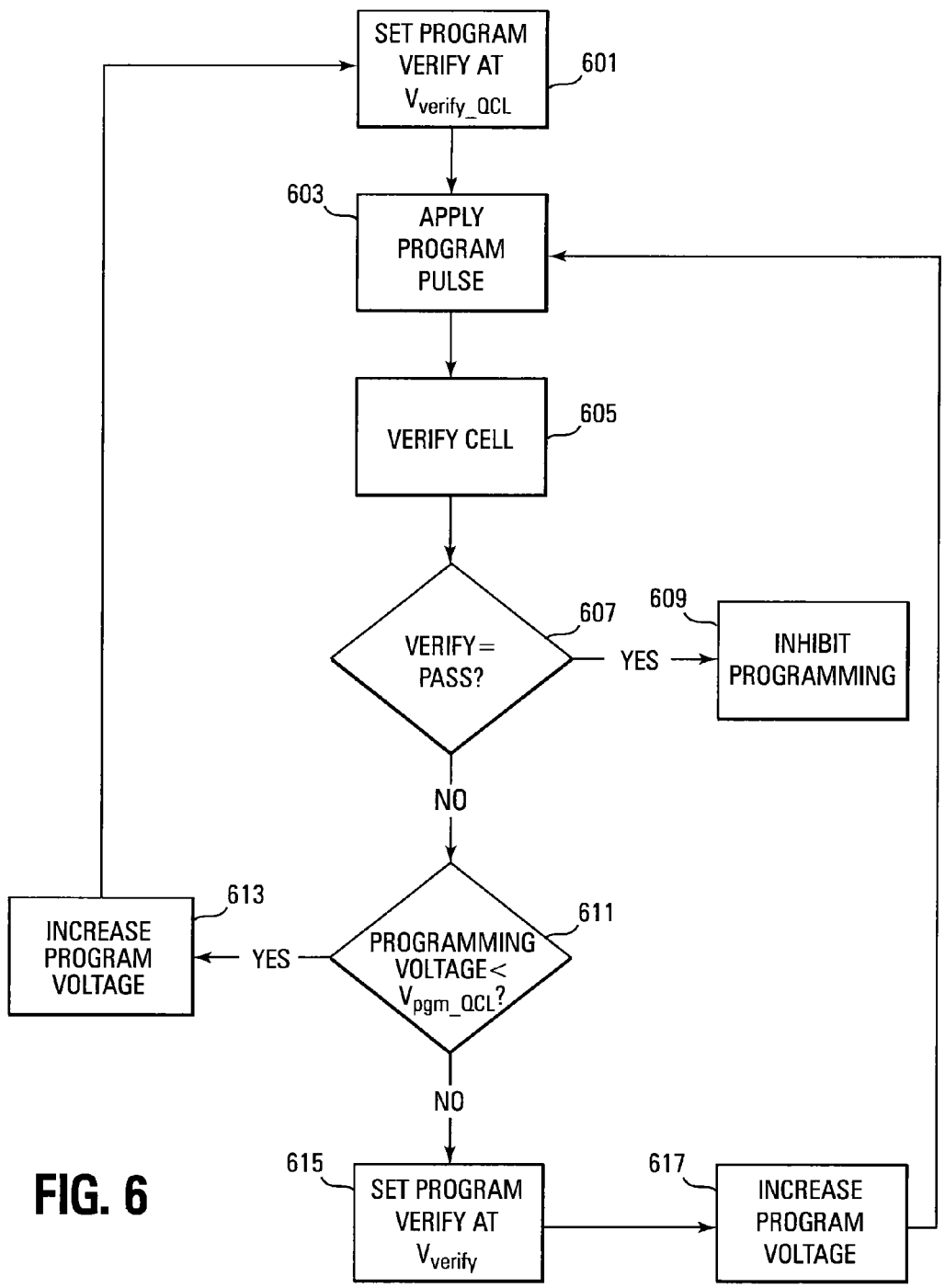
FIG. 6 shows a flowchart of one embodiment of a method for programming and program verify that incorporates multiple level verification.

FIG. 6 illustrates a flowchart of one embodiment of a method for programming and program verify, with multiple level verification, of selected memory cells, such as to reduce the effects of quick charge loss. The program verify voltage is initially set at $V_{verify\_QCL}$ 601. This voltage is defined as $V_{verify} + V_{QCL}$ where $V_{verify}$ is the verify voltage that would typically be used to verify a programming operation and $V_{QCL}$ is the $V_t$ drop of a memory cell due to QCL after a programming pulse has occurred.

$V_{QCL}$, in one embodiment, is determined by empirical experimentation. For example, an average quick charge loss response to each programmed voltage can be determined for a certain number of memory devices. Both $V_{verify}$ and $V_{QCL}$ are different for different programmed voltages, thus $V_{verify\_QCL}$ will be different for different programmed voltages.

An initial programming pulse is then applied to the control gate of the selected memory cell to be programmed 603. As previously discussed, this pulse is at an initial programming voltage (e.g., 16V) and increases the $V_t$ of that particular memory cell. A program verify operation is then performed on the memory cell 605 to determine if its $V_t$ has reached the $V_{verify\_QCL}$ level.

If the cell verify passes (e.g., $V_t$ is greater than or equal to $V_{verify\_QCL}$) 607, the memory cell has been programmed to at least the target threshold voltage and further programming is inhibited 609. In one embodiment, the programming inhibition can be accomplished by biasing the bit line to which the selected memory cell is coupled with a supply voltage (e.g., $V_{CC}$). This increases the memory cell's channel voltage and prevents further increases of the cell's $V_t$.

If the cell's $V_t$ is less than $V_{verify\_QCL}$ 607, the memory cell has failed the initial program verify operation and has not been programmed to the target threshold voltage. In this case, it is determined if the programming voltage is less than a reference voltage $V_{pgm\_QCL}$ 611. The reference voltage $V_{pgm\_QCL}$ is determined through experimentation and characterization of a memory device's technology. $V_{pgm\_QCL}$ is chosen to reduce program disturb, quick charge loss, and other detrimental flash memory characteristics.

If the programming voltage is less than $V_{pgm\_QCL}$, the programming voltage is incremented by a step voltage 613 and the method repeats from the initial step where the program verify voltage is set to $V_{verify\_QCL}$. The memory cell being programmed is thus again verified to the initial $V_{verify\_QCL}$ voltage. In one embodiment, the programming voltage is increased by a step voltage of 1V. Alternate embodiments may use other step voltages.

If the programming voltage is greater than or equal to $V_{pgm\_QCL}$ 611, the program verify voltage is set to $V_{verify}$. The $V_{verify}$ voltage is substantially equal to $V_{verify\_QCL}$ less the QCL voltage ($V_{QCL}$) and is substantially the same as the nominal verify voltage used during a typical verify operation. In one embodiment, $V_{verify}$ is 4.0V and $V_{QCL}$ is 0.2V resulting in a $V_{verify\_QCL}$ of 4.2V. Alternate embodiments can use different voltages.

The programming voltage is increased by a step voltage (e.g., 1.0V) 617 and the method is repeated from the application of the new programming pulse to the selected memory cell's control gate 603. The method now uses $V_{verify}$ as the new program verify voltage.

Figure 7:
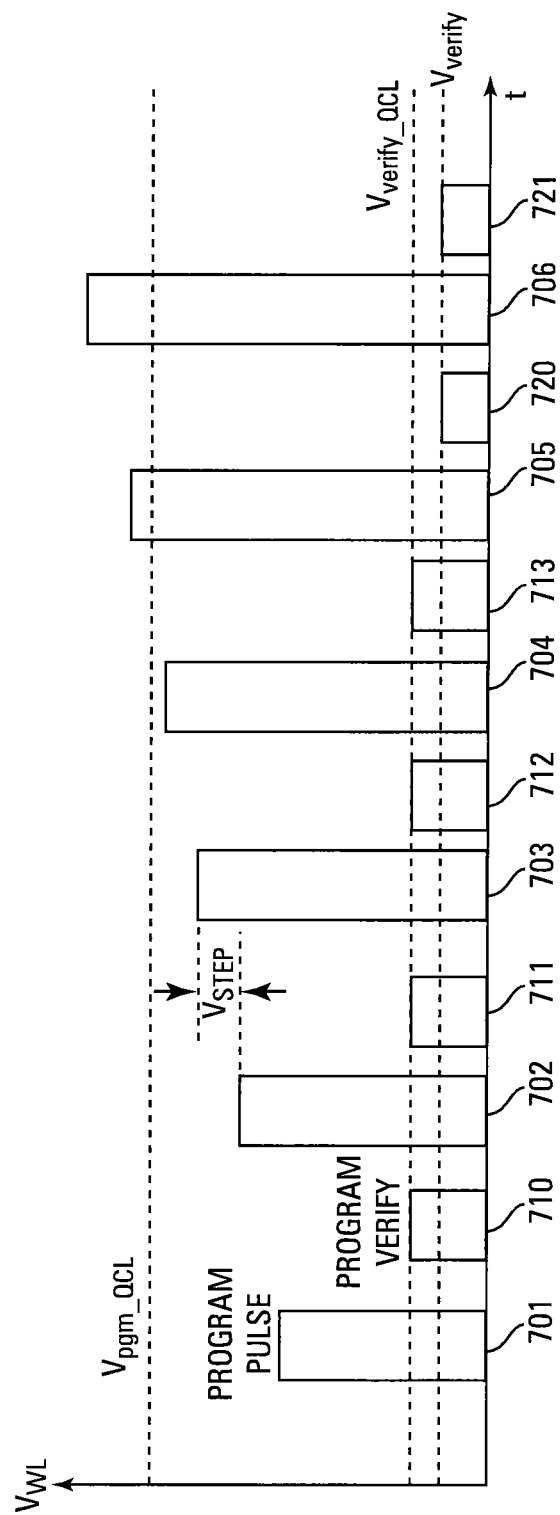
FIG. 7 shows a plot of $V_{WL}$ versus time for program and verify pulses in accordance with the method of FIG. 6.

FIG. 7 illustrates a plot of programming and program verify pulses that result from the method of FIG. 6. The programming pulses 701-706 are shown increasing in amplitude, from the initial pulse 701 to the final pulse 706, by an increment voltage $V_{step}$. Initially, the program verify pulses 710-713 are at the $V_{verify\_QCL}$ level as described previously. Once a programming pulse 705 has an amplitude greater than a reference voltage (e.g., $V_{pgm\_QCL}$), the program verify voltage is reduced to $V_{verify}$ so that the remaining program verify pulses 720, 721 for the current programming operation are at the $V_{verify}$ level. This continues until the selected memory cell passes the program verify operation or the programming algorithm concludes.

Figure 8:
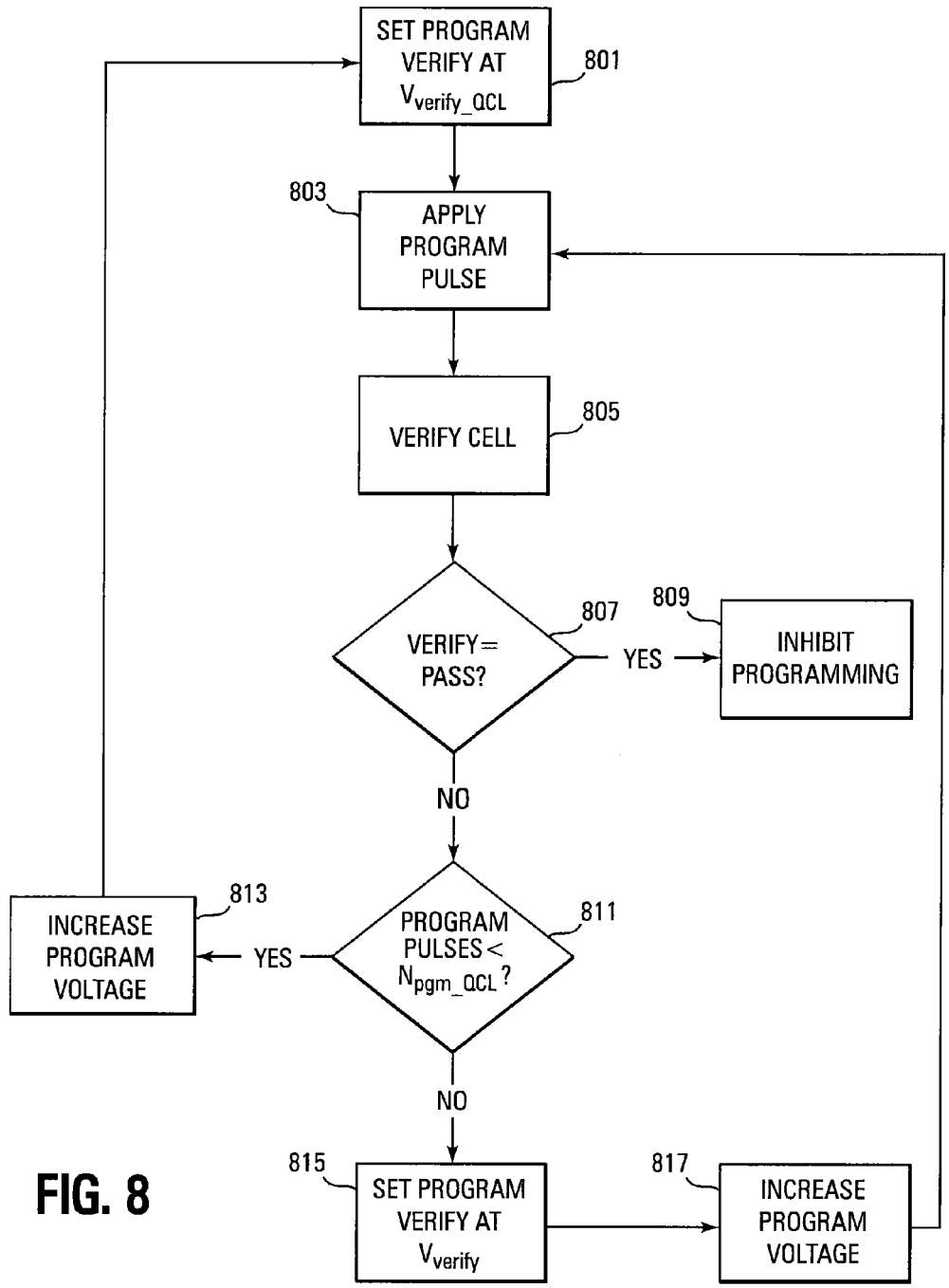
FIG. 8 shows a flowchart of an alternate embodiment of a method for programming and program verify that incorporates multiple level verification.

FIG. 8 illustrates a flowchart of an alternate embodiment of a method for programming and program verify, with multiple level verification, of selected memory cells to reduce the effects of quick charge loss. In this embodiment, the change in $V_{verify}$ is triggered by a number of programming pulses instead of the programming voltage of the embodiment of FIG. 6.

The program verify voltage is initially set at $V_{verify\_hd\ QCL}$ 801. This voltage is defined as $V_{verify}+V_{QCL}$ where $V_{verify}$ is the verify voltage that would typically be used to verify a programming operation and $V_{QCL}$ is the $V_t$ drop of a memory cell due to QCL after a programming pulse has occurred.

An initial programming pulse is then applied to the control gate (e.g., biasing the word line) of the selected memory cell to be programmed 803. As previously discussed, this pulse is at an initial programming voltage (e.g., 16V) and increases the $V_t$ of that particular memory cell. A program verify operation is then performed on the memory cell 805 to determine if its $V_t$ has reached the $V_{verify\_QCL}$ level.

If the cell verify passes (e.g., $V_t$ is greater than or equal to $V_{verify\_QCL}$) 807, the memory cell has been programmed to at least the target threshold voltage and further programming is inhibited 809. In one embodiment, the programming inhibition can be accomplished by biasing the bit line to which the selected memory cell is coupled with a supply voltage (e.g., $V_{CC}$). This increases the memory cell's channel voltage and prevents further increases of the cell's $V_t$.

If the cell's $V_t$ is less than $V_{verify\_QCL}$ 807, the memory cell has failed the initial program verify operation and has not been programmed to the target threshold voltage. In this case, it is determined if the number of programming pulses has reached a particular pulse count (e.g., $N_{pgm\_QCL}$) 811. The reference pulse count $N_{pgm\_QCL}$ is determined through experimentation and characterization of a memory device's technology. $N_{pgm\_QCL}$ is chosen to reduce program disturb, quick charge loss, and other detrimental flash memory characteristics.

If the pulse count is less than $N_{pgm\_QCL}$, the programming voltage is incremented by a step voltage 813 and the method repeats from the initial step where the program verify voltage is set to $V_{verify\_QCL}$. The memory cell being programmed is thus again verified to the initial $V_{verify\_QCL}$ voltage. In one embodiment, the programming voltage is increased by a step voltage of 1V. Alternate embodiments may use other step voltages.

If the pulse count is greater than or equal to $N_{pgm\_QCL}$ 811, the program verify voltage is set to $V_{verify}$ 815. The $V_{verify}$ voltage is substantially equal to $V_{verify\_QCL}$ less the QCL voltage ($V_{QCL}$) and is substantially the same as the typical verify voltage used during a normal verify operation. In one embodiment, $V_{verify}$ is 4.0V and $V_{QCL}$ is 0.2V resulting in a $V_{verify\_QCL}$ of 4.2V. Alternate embodiments can use different voltages.

The programming voltage is increased by a step voltage (e.g., 1.0V) 817 and the method is repeated from the application of the new programming pulse to the selected memory cell's control gate 803. The method now uses $V_{verify}$ as the new program verify voltage.

Figure 9:
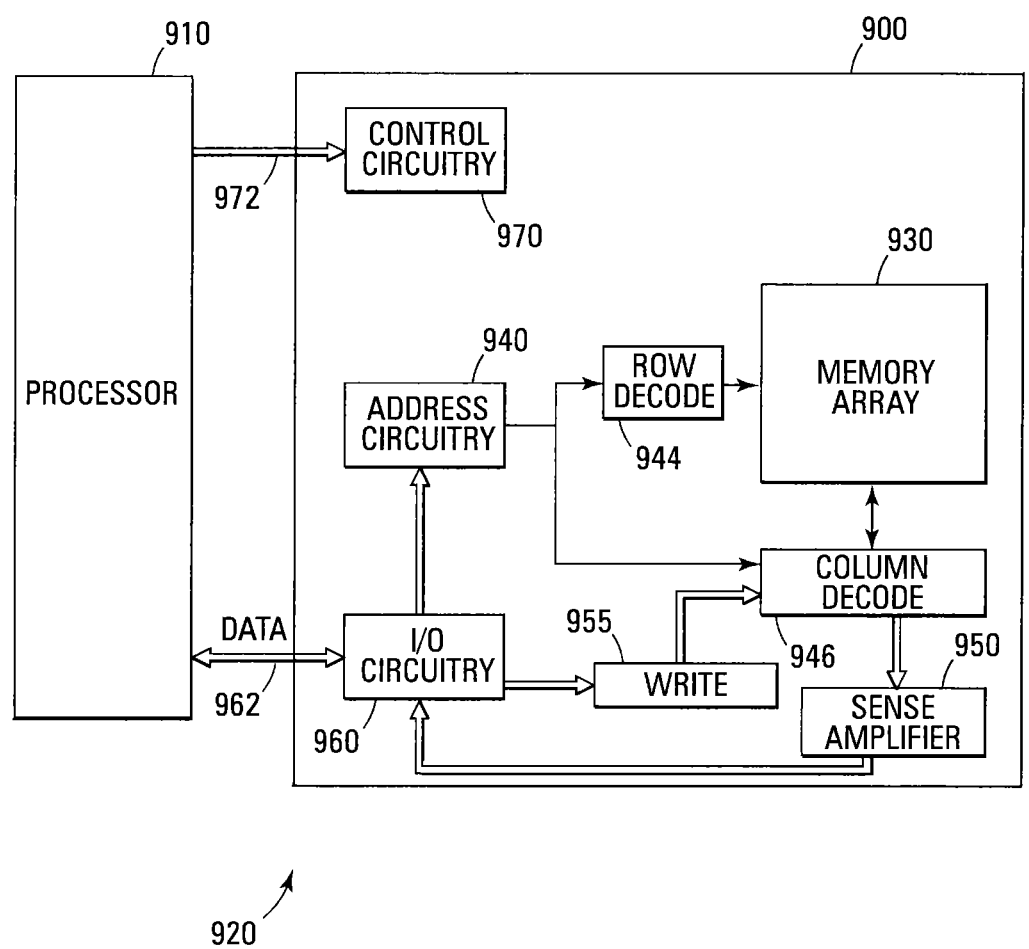
FIG. 9 shows a block diagram of one embodiment of a memory system.

FIG. 9 illustrates a functional block diagram of a memory device 900. The memory device 900 is coupled to an external processor 910. The processor 910 may be a microprocessor or some other type of controller. The memory device 900 and the processor 910 form part of a memory system 920. The memory device 900 has been simplified to focus on features of the memory that are helpful in understanding the present invention.

Figure 3:
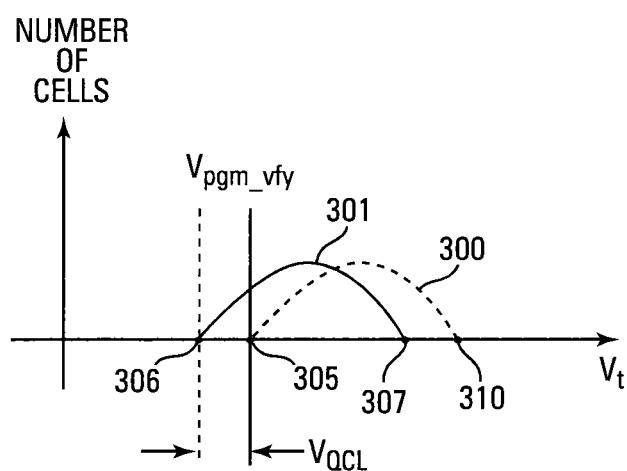
FIG. 3 shows a typical prior art $V_t$ distribution, in accordance with FIG. 2, that has been affected by quick charge loss.

The memory device 900 includes an array 930 of non-volatile memory cells, such as the one illustrated previously in FIG. 3. The memory array 930 is arranged in banks of word line rows and bit line columns. In one embodiment, the columns of the memory array 930 are comprised of series strings of memory cells. As is well known in the art, the connections of the cells to the bit lines determines whether the array is a NAND architecture, an AND architecture, or a NOR architecture.

Address buffer circuitry 940 is provided to latch address signals provided through the I/O circuitry 960. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense amplifier circuitry 950. The sense amplifier circuitry 950, in one embodiment, is coupled to read and latch a row of data from the memory array 930. Data input and output buffer circuitry 960 is included for bidirectional data communication as well as address communication over a plurality of data connections 962 with the controller 910. Write circuitry 955 is provided to write data to the memory array.

Memory control circuitry 970 decodes signals provided on control connections 972 from the processor 910. These signals are used to control the operations on the memory array 930, including data read, data write (program), and erase operations. The memory controller circuitry 970 may be a state machine, a sequencer, or some other type of controller to generate the memory control signals. In one embodiment, the memory control circuitry 970 is configured to execute the programming and multiple level program verify method of the present embodiments in order to reduce the effects of quick charge loss in the memory device.

The flash memory device illustrated in FIG. 9 has been simplified to facilitate a basic understanding of the features of the memory. A more detailed understanding of internal circuitry and functions of flash memories are known to those skilled in the art.

CONCLUSION

In summary, one or more embodiments can reduce the effects of quick charge loss in a memory device during a programming operation. In one such embodiment, a dynamic, multiple level program verify voltage is used during program verify of the selected memory cell. The program verify voltage is initially increased, such as to compensate for the charge loss experienced after programming. After the programming voltage of an associated programming pulse reaches a reference voltage level or the number of programming pulses have reached a certain pulse count threshold, the program verify voltage is set to a lower program verify voltage.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
    a memory array comprising a plurality of memory cells; and
    control circuitry coupled to the memory array for controlling operation of the memory array, wherein the control circuitry is configured to control generation of a dynamic program verify voltage that is adjusted in response to a programming voltage being at least equal to a reference voltage, and the control circuitry is further configured to control generation of a series of increasing programming voltages, each programming voltage followed by a program verify voltage, wherein the control circuitry is configured to inhibit programming of memory cells having a threshold voltage at least equal to a target voltage.

2. The memory device of claim 1 wherein the control circuitry is further configured to inhibit programming of the memory cells having the threshold voltage at least equal to the target voltage by controlling a bias of a bit line coupled to the memory cells with a supply voltage.

3. The memory device of claim 1 wherein the control circuitry is further configured to inhibit programming of the memory cells having the threshold voltage at least equal to the target voltage by increasing a channel voltage of the memory cells.

4. The memory device of claim 1 wherein the control circuitry is further configured to control generation of the program verify voltage such that the program verify voltage is equal to $V_{verify\_QCL} - V_{QCL}$ where $V_{verify\_QCL}$ is an initial program verify voltage and $V_{QCL}$ is a threshold voltage drop of a memory cell due to quick charge loss after a programming pulse has occurred.

5. The memory device of claim 4 wherein the control circuitry is further configured to use $V_{verify\_QCL} - V_{QCL}$ as an initial verify voltage after a subsequent programming voltage.

6. The memory device of claim 1 wherein the control circuitry is further configured to control generation of the programming voltage by controlling generation of a programming pulse at the programming voltage.

7. The memory device of claim 5 wherein the control circuitry is further configured to control generation of $V_{verify\_QCL}$ by adding an initial verify voltage to a quick charge loss voltage.

8. A method for multiple level program verify in a memory device, the method comprising:
    applying a plurality of programming pulses to a selected memory cell;
    performing a program verify after each programming pulse wherein a voltage of the program verify changes in response to a quantity of programming pulses being applied to the selected memory cell; and
    inhibiting programming of the selected memory cell when the program verify indicates that a threshold voltage of the selected memory cell is at least equal to a target voltage.

9. The method of claim 8 wherein a first program verify uses a higher voltage than a subsequent program verify.

10. The method of claim 8 wherein the programming voltage of an associated programming pulse is greater than or equal to a reference voltage.

11. The method of claim 10 wherein the reference voltage is determined in response to quick charge loss characteristics of the memory device.

12. The method of claim 10 and further including:
    increasing each subsequent programming pulse of the plurality of programming pulses by a step voltage to generate an incremented programming pulse; and
    comparing each incremented programming pulse to the reference voltage.

13. The method of claim 11 wherein an initial program verify voltage is determined in response to the quick charge loss characteristics of the memory device.

14. A method for multiple level program verify in a memory device, the method comprising:
    applying a program verify pulse, at an initial program verify voltage, to the memory cell after an initial programming pulse, wherein the initial program verify voltage is a verify voltage that has been increased by a quick charge loss voltage;
    subtracting the quick charge loss voltage from the initial program verify voltage after one of either a subsequent programming pulse to the initial programming pulse has reached a reference voltage or a quantity of programming pulses has reached a pulse count threshold; and
    inhibiting programming of the memory cell when a threshold voltage of the memory cell is at least equal to a target threshold voltage.

15. The method of claim 14 and further comprising increasing the quantity of programming pulses and not decreasing the voltage of subsequent program verify pulses when the programming pulse is less than the reference voltage.

16. The method of claim 14 and further comprising decreasing a program verify voltage and increasing a programming voltage in response to the programming voltage being equal to or greater than the reference voltage.

17. The method of claim 14 and further comprising determining the pulse count threshold by characterization of a type of memory device.

18. The method of claim 14 and further comprising determining the initial program verify voltage takes into account electrons trapped in a tunnel oxide layer of the memory cell.

19. The method of claim 14 wherein the subsequent programming pulse is increased by a step voltage.

20. The method of claim 19 wherein the step voltage is substantially 1V.

* * * * *